(12) United States Patent
Yoshinaga

(10) Patent No.: US 6,496,131 B2
(45) Date of Patent: Dec. 17, 2002

(54) CAPACITOR-ARRAY D/A CONVERTER INCLUDING A THERMOMETER DECODER AND A CAPACITOR ARRAY

(75) Inventor: Chikashi Yoshinaga, Kumamoto (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/963,063

(22) Filed: Sep. 25, 2001

(65) Prior Publication Data

US 2002/0036580 A1 Mar. 28, 2002

(30) Foreign Application Priority Data

Sep. 26, 2000 (JP) ...................................... 2000-291767

(51) Int. Cl.[7] .............................................. H03M 1/66
(52) U.S. Cl. ...................................... 341/150; 341/145
(58) Field of Search ................................ 341/118, 120, 341/143, 144, 145, 150

(56) References Cited

U.S. PATENT DOCUMENTS

| | | | |
|---|---|---|---|
| 5,949,362 A | 9/1999 | Tesch et al. | |
| 5,977,899 A | * 11/1999 | Adams | 341/145 |
| 6,154,162 A | * 11/2000 | Watson et al. | 341/150 |
| 6,236,346 B1 | 5/2001 | Schofield et al. | |

* cited by examiner

Primary Examiner—Patrick Wamsley
(74) Attorney, Agent, or Firm—Hayes Soloway PC

(57) ABSTRACT

In a capacitor-array D/A converter which includes a thermometer decoder (103) for thermometer-decoding a decoder input signal having first through m-th (m is an integer not less than two) input bits to produce an output signal having first through n-th ($n=2^m-1$) output bits, where m is an integer not less than two and where n is equal to ($2^m-1$), first through n-th switches (SU1 to SU31) corresponding to the first through the n-th output bits of the thermometer decoder, and a capacitor array (104) including first through n-th capacitors (8C1 through 8C31) corresponding to the first through the n-th switches, the first through the n-th capacitors are arranged in a main area of the capacitor array and in a row direction of the capacitor array consecutively from the center outward to the left and the right to be symmetrical. Each of the first through the n-th switches are supplied with a corresponding bit of the first through the n-th output bits from the thermometer decoder. The corresponding bit corresponds to each of the first through the n-th switches under consideration. Each of the first through the n-th switches operates so that, when the corresponding bit has a logic "1" level, a corresponding capacitor of the first through the n-th capacitors is applied with a predetermined voltage not equal to zero and that, when the corresponding bit has a logic "0" level, the corresponding capacitor is grounded. The corresponding capacitor corresponds to each of the first through the n-th switches.

7 Claims, 13 Drawing Sheets

|    | x  | y  | Σx | Σy | E = Σx + Σy |
|----|----|----|----|----|----|
| 1  | -2 | -2 | -2 | -2 | -4 |
| 2  | +1 | +2 | -1 | 0  | -1 |
| 3  | -1 | +2 | -2 | +2 | 0  |
| 4  | +2 | -2 | 0  | 0  | 0  |
| 5  | +2 | +1 | +2 | +1 | +3 |
| 6  | -1 | -1 | +1 | 0  | +1 |
| 7  | +1 | -1 | +2 | -1 | +1 |
| 8  | -2 | +1 | 0  | 0  | 0  |
| 9  | +2 | -1 | +2 | -1 | -1 |
| 10 | -1 | +1 | +1 | 0  | +1 |
| 11 | +1 | +1 | +2 | +1 | +3 |
| 12 | -2 | -1 | 0  | 0  | 0  |
| 13 | -2 | +2 | -2 | +2 | 0  |
| 14 | +1 | -2 | -1 | 0  | -1 |
| 15 | -1 | -2 | -2 | -2 | -4 |
| 16 | +2 | +2 | 0  | 0  | 0  |

FIG. 4  PRIOR ART

THERMOMETER DECODER (5-BIT INPUT)

| INPUT | | | | | OUTPUT | | | | | | |
|---|---|---|---|---|---|---|---|---|---|---|---|
| D7 | D6 | D5 | D4 | D3 | T31 | T30 | ... | T4 | T3 | T2 | T1 |
| 0 | 0 | 0 | 0 | 0 | 0 | 0 | ... | 0 | 0 | 0 | 0 |
| 0 | 0 | 0 | 0 | 1 | 0 | 0 | ... | 0 | 0 | 0 | 1 |
| 0 | 0 | 0 | 1 | 0 | 0 | 0 | ... | 0 | 0 | 1 | 1 |
| 0 | 0 | 0 | 1 | 1 | 0 | 0 | ... | 0 | 1 | 1 | 1 |
| 0 | 0 | 1 | 0 | 0 | 0 | 0 | ... | 1 | 1 | 1 | 1 |
| 0 | 0 | 1 | 0 | 1 | 0 | 0 | ... | 1 | 1 | 1 | 1 |
| 0 | 0 | 1 | 1 | 0 | 0 | 0 | ... | 1 | 1 | 1 | 1 |
| 0 | 0 | 1 | 1 | 1 | 0 | 0 | ... | 1 | 1 | 1 | 1 |
| 0 | 1 | 0 | 0 | 0 | 0 | 0 | ... | 1 | 1 | 1 | 1 |
| 0 | 1 | 0 | 0 | 1 | 0 | 0 | ... | 1 | 1 | 1 | 1 |
| 0 | 1 | 0 | 1 | 0 | 0 | 0 | ... | 1 | 1 | 1 | 1 |
| 0 | 1 | 0 | 1 | 1 | 0 | 0 | ... | 1 | 1 | 1 | 1 |
| 0 | 1 | 1 | 0 | 0 | 0 | 0 | ... | 1 | 1 | 1 | 1 |
| 0 | 1 | 1 | 0 | 1 | 0 | 0 | ... | 1 | 1 | 1 | 1 |
| 0 | 1 | 1 | 1 | 0 | 0 | 0 | ... | 1 | 1 | 1 | 1 |
| 0 | 1 | 1 | 1 | 1 | 0 | 0 | ... | 1 | 1 | 1 | 1 |
| 1 | 0 | 0 | 0 | 0 | 0 | 0 | ... | 1 | 1 | 1 | 1 |
| 1 | 0 | 0 | 0 | 1 | 0 | 0 | ... | 1 | 1 | 1 | 1 |
| 1 | 0 | 0 | 1 | 0 | 0 | 0 | ... | 1 | 1 | 1 | 1 |
| 1 | 0 | 0 | 1 | 1 | 0 | 0 | ... | 1 | 1 | 1 | 1 |
| 1 | 0 | 1 | 0 | 0 | 0 | 0 | ... | 1 | 1 | 1 | 1 |
| 1 | 0 | 1 | 0 | 1 | 0 | 0 | ... | 1 | 1 | 1 | 1 |
| 1 | 0 | 1 | 1 | 0 | 0 | 0 | ... | 1 | 1 | 1 | 1 |
| 1 | 0 | 1 | 1 | 1 | 0 | 0 | ... | 1 | 1 | 1 | 1 |
| 1 | 1 | 0 | 0 | 0 | 0 | 0 | ... | 1 | 1 | 1 | 1 |
| 1 | 1 | 0 | 0 | 1 | 0 | 0 | ... | 1 | 1 | 1 | 1 |
| 1 | 1 | 0 | 1 | 0 | 0 | 0 | ... | 1 | 1 | 1 | 1 |
| 1 | 1 | 0 | 1 | 1 | 0 | 0 | ... | 1 | 1 | 1 | 1 |
| 1 | 1 | 1 | 0 | 0 | 0 | 0 | ... | 1 | 1 | 1 | 1 |
| 1 | 1 | 1 | 0 | 1 | 0 | 0 | ... | 1 | 1 | 1 | 1 |
| 1 | 1 | 1 | 1 | 0 | 0 | 1 | ... | 1 | 1 | 1 | 1 |
| 1 | 1 | 1 | 1 | 1 | 1 | 1 | ... | 1 | 1 | 1 | 1 |

FIG. 7

THERMOMETER DECODER (3-BIT INPUT)

| INPUT | | | OUTPUT | | | | | | |
|---|---|---|---|---|---|---|---|---|---|
| D5 | D4 | D3 | T7 | T6 | T5 | T4 | T3 | T2 | T1 |
| 0 | 0 | 0 | 0 | 0 | 0 | 0 | 0 | 0 | 0 |
| 0 | 0 | 1 | 0 | 0 | 0 | 0 | 0 | 0 | 1 |
| 0 | 1 | 0 | 0 | 0 | 0 | 0 | 0 | 1 | 1 |
| 0 | 1 | 1 | 0 | 0 | 0 | 0 | 1 | 1 | 1 |
| 1 | 0 | 0 | 0 | 0 | 0 | 1 | 1 | 1 | 1 |
| 1 | 0 | 1 | 0 | 0 | 1 | 1 | 1 | 1 | 1 |
| 1 | 1 | 0 | 0 | 1 | 1 | 1 | 1 | 1 | 1 |
| 1 | 1 | 1 | 1 | 1 | 1 | 1 | 1 | 1 | 1 |

FIG. 8

CAPACITOR-ARRAY D/A CONVERTER INCLUDING A THERMOMETER DECODER AND A CAPACITOR ARRAY

BACKGROUND OF THE INVENTION

This invention relates to a capacitor-array D/A converter including a capacitor array and, in particular, to a capacitor arrangement for use in the capacitor array of the capacitor-array D/A converter.

An existing D/A (digital-to-analog) converter is used in various kinds of electronic circuits to convert a digital signal into a corresponding analog signal. With an improvement in performance of the electronic circuits, the D/A converter is required to have high accuracy.

For example, U.S. Pat. Nos. 5,949,362 and 6,236,346 disclose techniques for increasing the accuracy of the D/A converter, i.e., techniques for improving the linearity of a conversion characteristic upon conversion from a digital code into an analog voltage.

Referring to FIG. 1, description will be made of a current cell arrangement of a D/A converter disclosed in U.S. Pat. No. 5,949,362 as a first conventional technique for improving the linearity. A current cell matrix 25 comprises a first array 31 of a plurality of current source cells 32 positioned to the right of a dashed line 33. The cells of the first array 31 extend in first and second directions perpendicular to each other. The current cell matrix 25 is provided with two-dimensional symmetrical control means 35 for operating predetermined current source cells of the first array 31 based upon at least a portion of digital input words and in a symmetrical sequence in both the first and the second directions with respect to a medial position of the first array. The medial position defines a centroid for the first array as shown by an imaginary point 39. As an increasing number of current sources are switched, the current source cells labeled 1–31 are sequentially operated. Accordingly, the D/A converter illustrated in FIG. 1 is less susceptible to variations in threshold voltage and current factor as may otherwise be caused by process gradients.

The first array 31 further comprises a plurality of second current source cells or LSB cells 32a labeled D0 through D4 in FIG. 1. The two-dimensional symmetrical control means 35 further comprises LSB cell control means for operating the LSB current source cells 32a based upon predetermined least significant bits (LSBs) of the digital input words. The LSB current source cells (D1–D4) are positioned in a medial portion of the first array to reduce the influence of process gradients. The D/A converter 25 includes a second array 38 substantially similar to the first array 31 and located adjacent the first array 31. The two-dimensional symmetrical control means 35 includes geometrical averaging means for operating the current source cells 32 in the first and second arrays 31 and 38 in pairs and in a substantially true mirror image sequence. For example, both cells of a pair may be connected to the same control signal and the output of each cell is half the desired combined output current.

Referring to FIG. 2, description will be made of a capacitor arrangement of a D/A converter which is disclosed in U.S. Pat. No. 6,236,346 as a second conventional technique for improving the linearity. Respective capacitance elements C are included in different cells 44 of a cell array 42. The cells 44 have switch circuits 46-1 to 46-16, respectively. Each switch circuit 46 has an input node connected to an output node (denoted by "X" in FIG. 2) of a corresponding one of the cells 44. The output node is connected to a bottom plate of the capacitance element C in the cell. Each switch circuit 46 has three terminals, i.e., first through third terminals. The first terminals of the switch circuits 46 are connected in common to receive an input voltage VIN. The second terminals are connected in common to receive a negative reference voltage VSS. The third terminals are connected in common to receive a predetermined reference potential VREF. Each switch circuit 46 is controllable, in response to a selection signal S supplied thereto, to connect the input node to one of the first, the second, and the third terminals. The capacitance elements C in the different cells have top plates connected in common as an output VTOP of the D/A converter.

Referring to FIG. 3, five binary-weighted capacitors C0 to C4 are provided by the capacitance elements C in the different cells. The capacitor C0 is provided by the capacitance element C of the cell 1 alone. The capacitor C1 is provided by the capacitance element C of the cell 2 alone. The capacitor C2 is provided by the capacitance elements C of the cells 3 and 4 connected in parallel. The capacitor C3 is provided by the capacitance elements C of the cells 5 to 8 connected in parallel. The capacitor C4 is provided by the capacitance elements C of the cells 9 to 16 connected in parallel. Therefore, the capacitance ratio of the capacitors C0 to C4 is 1:1:2:4:8.

For each row, each column, and each diagonal of the cell array 42, the sum of respective selection-sequence positions of the cells is the same (34 in this case). Referring to FIG. 4, a table shows an x-error and a y-error for each ordinal position in the selection sequence of the cells. For those cells that are selected in response to a given input code, the x-errors are summed to produce a total x-error $\Sigma x$ and the y-errors are summed to produce a total y-error $\Sigma y$. By arranging the cell array in the configuration of a magic square as illustrated in FIG. 2, it is possible to realize a high-accuracy cell array circuit capable of two-dimensionally canceling an accumulation of graded and symmetrical errors in different rows and columns and to realize a high-accuracy D/A converter.

However, if the first conventional technique is similarly applied to a capacitor-array D/A converter or in case of the capacitor-array D/A converter according to the second conventional technique, the following disadvantages will arise.

As a first problem, the linearity of the D/A converter is deteriorated under the effect of a parasitic capacitance.

The reason is as follows. An output voltage of the D/A converter of a current cell matrix type according to the first conventional technique is determined exclusively by current values of the respective current source cells. On the other hand, an output voltage of the capacitor-array D/A converter is determined by capacitive voltage division from the sum of (1) capacitance values of the respective array capacitors, (2) capacitance values of coupling capacitors produced between the capacitors and connection lines for connecting the array capacitors and the switches, and (3) capacitance values of coupling capacitors produced between the array capacitors and connection lines for connecting the array capacitors to one another. In the first conventional technique, control is carried out by means of a mirror image (or symmetrical) arrangement and a mirror image (or symmetrical) sequence. Under such control, however, no more than the influence of variation in production accuracy of the current source cells is suppressed. Rather, the complexity in arrangement and control results in a complicated layout of the connection lines for transmission of control signals. Therefore, complicated coupling occurs between the array capacitors and the connection lines for connecting the array capacitors and the switches and between the array capacitors and the connection lines for connecting the array capacitors to one another. As a result, the linearity of the output voltage is degraded. In the second conventional technique, the capacitor cells are arranged in the configuration of the magic square. In this case also, no more than the influence of variation in production accuracy of capacitor cells is suppressed and the complexity in arrangement results in a complicated layout of the connection lines for the control signals. The linearity is deteriorated under the effect of the coupling capacitors in the similar manner as mentioned in conjunction with the first conventional technique.

A second problem is an increase in circuit scale.

This is because the array is divided into upper and lower rows in order to realize the mirror image arrangement. The mirror image arrangement as in the first conventional technique can not be realized by a single-row array. If the array divided into the upper and the lower rows is controlled by the control circuit located on one side of the array, a control signal for a switch corresponding to another capacitor on the other side passes over a capacitor on the one side. In this event, the linearity is deteriorated under the influence of coupling between the array capacitor and the control signal for the switch corresponding to another array capacitor. In order to prevent the control signal for the switch corresponding to another array capacitor from passing over the array capacitor, control circuits must be arranged at least on two sides, i.e., upper and lower sides. In this case, since the control circuits are separately arranged and supplied with signals from a single common decoder, a wide space is required for connection lines for transmission of the control signals. Furthermore, in order to realize the mirror image sequence, two similar arrays are provided. As a result, an array area, the number of control circuits, and the number of control signals are doubled.

SUMMARY OF THE INVENTION

It is an object of this invention to provide a capacitor-array D/A converter and a capacitor array for the capacitor-array D/A converter which are capable of solving the above-mentioned problems.

Capacitor-array D/A converters according to this invention are as follows:

(1) A capacitor-array D/A converter which comprises:

a thermometer decoder (103) for thermometer-decoding a decoder input signal having first through m-th input bits (D3 to D7) to produce an output signal (107) having first through n-th output bits (T1 to T31), where m is an integer not less than two and where n is equal to $(2^m-1)$;

first through n-th switches (SU1 to SU31) corresponding to the first through the n-th output bits of the thermometer decoder; and a capacitor array (104) comprising first through n-th capacitors (8C1 through 8C31) corresponding to the first through the n-th switches;

each of the first through the n-th switches being supplied with a corresponding bit of the first through the n-th output bits from the thermometer decoder, the corresponding bit corresponding to the each of the first through the n-th switches, each of the first through the n-th switches operating so that, when the corresponding bit has a logic "1" level, a corresponding capacitor of the first through the n-th capacitors is applied with a predetermined voltage (VREF) not equal to zero and that, when the corresponding bit has a logic "0" level, the corresponding capacitor is grounded (205), the corresponding capacitor corresponding to the each of the first through the n-th switches;

the capacitor array having a main area;

the first through the n-th capacitors being arranged in the main area and in a row direction of the capacitor array consecutively from the center outward to the left and the right to be symmetrical.

(2) A capacitor-array D/A converter as described in (1), wherein:

the first and the m-th input bits of the decoder input signal of the thermometer decoder are a least significant bit and a most significant bit of the decoder input signal, respectively;

the first and the n-th output bits of the output signal of the thermometer decoder being a least significant bit and a most significant bit of the output signal, respectively.

(3) A capacitor-array D/A converter as described in (1), further comprising first through n-th connection lines (312) corresponding to the first through the n-th switches;

each of the first through the n-th switches operating so that, when the corresponding bit has a logic "1" level, the corresponding capacitor is applied with the predetermined voltage through a corresponding connection line of the first through the n-th connection lines and that, when the corresponding bit has a logic "0" level, the corresponding capacitor is grounded through the corresponding connection line, the corresponding connection line corresponding to the each of the first through the n-th switches.

(4) A capacitor-array D/A converter as described in (3), the capacitor array having an additional area adjacent to the main area in a column direction which is perpendicular to the row direction, wherein:

the first through the n-th switches are arranged in the adjacent area of the capacitor array and in the row direction consecutively from the center outward to the left and the right to be symmetrical;

the first through the n-th connection lines extending in the column direction without intersecting with one another.

(5) A capacitor-array D/A converter as described in (4), wherein:

the capacitor array further comprises dummy capacitors (8CD1, 8CD2) each of which does not correspond to any one of the first through the n-th switches and is permanently connected to the ground, the dummy capacitors being arranged in the main area at both sides of the first through the n-th capacitors.

Capacitor arrays according to this invention are as follows:

(6) A capacitor array (104) for use in a capacitor-array D/A converter which comprises:

a thermometer decoder (103) for thermometer-decoding a decoder input signal having first through m-th input bits (D3 to D7) to produce an output signal (107) having first through n-th output bits (T1 to T31), where m is an integer not less than two and where n is equal to $(2^m-1)$;

first through n-th switches (SU1 to SU31) corresponding to the first through the n-th output bits of the thermometer decoder; and the capacitor array comprising first through n-th capacitors (8C1 through 8C31) corresponding to the first through the n-th switches;

each of the first through the n-th switches being supplied with a corresponding bit of the first through the n-th output bits from the thermometer decoder, the corresponding bit corresponding to the each of the first through the n-th switches, each of the first through the n-th switches operating so that, when the corresponding bit has a logic "1" level, a corresponding capacitor of the first through the n-th capacitors is applied with a predetermined voltage (VREF) not equal to zero and that, when the corresponding bit has a logic "0" level, the corresponding capacitor is grounded (205), the corresponding capacitor corresponding to the each of the first through the n-th switches;

the capacitor array having a main area; wherein:

the first through the n-th capacitors are arranged in the main area and in a row direction of the capacitor array consecutively from the center outward to the left and the right to be symmetrical.

(7) A capacitor array as described in (6), wherein:

the first and the m-th input bits of the decoder input signal of the thermometer decoder are a least significant bit and a most significant bit of the decoder input signal, respectively;

the first and the n-th output bits of the output signal of the thermometer decoder being a least significant bit and a most significant bit of the output signal, respectively.

BRIEF DESCRIPTION OF THE DRAWINGS

FIG. 4 shows a table for describing the effects of graded and symmetrical errors in the capacitor arrangement in FIG. 2;

FIG. 7 is a view for describing the relationship between an input and an output of a thermometer decoder illustrated in FIG. 5;

FIG. 8 is a view for describing the relationship between an input and an output of a 3-bit input thermometer decoder;

DESCRIPTION OF THE PREFERRED EMBODIMENTS

Figure 1:
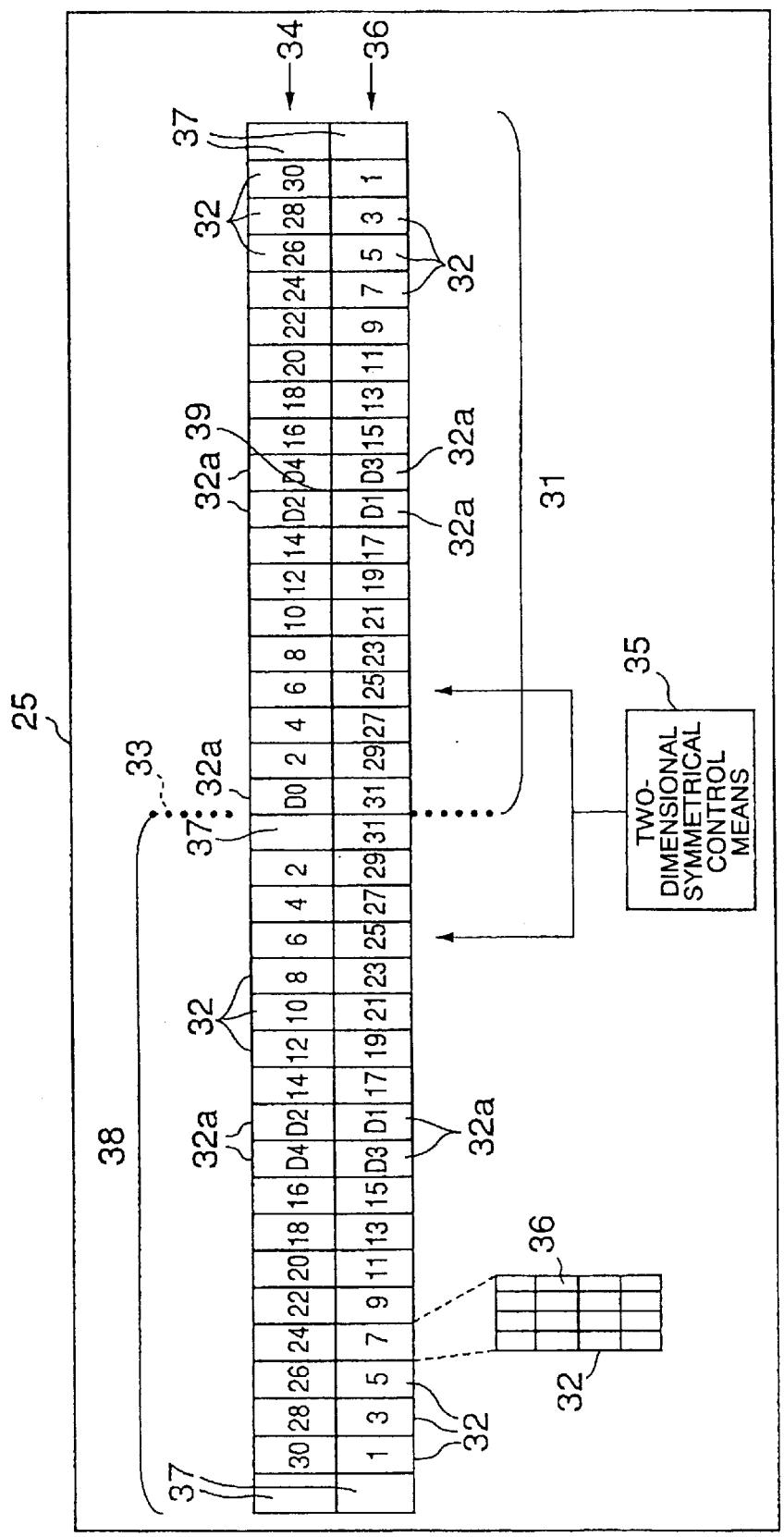
FIG. 1 shows a current cell arrangement in a first conventional technique.

Now, description will be made of embodiments of this invention with reference to the drawing.

Figure 5:
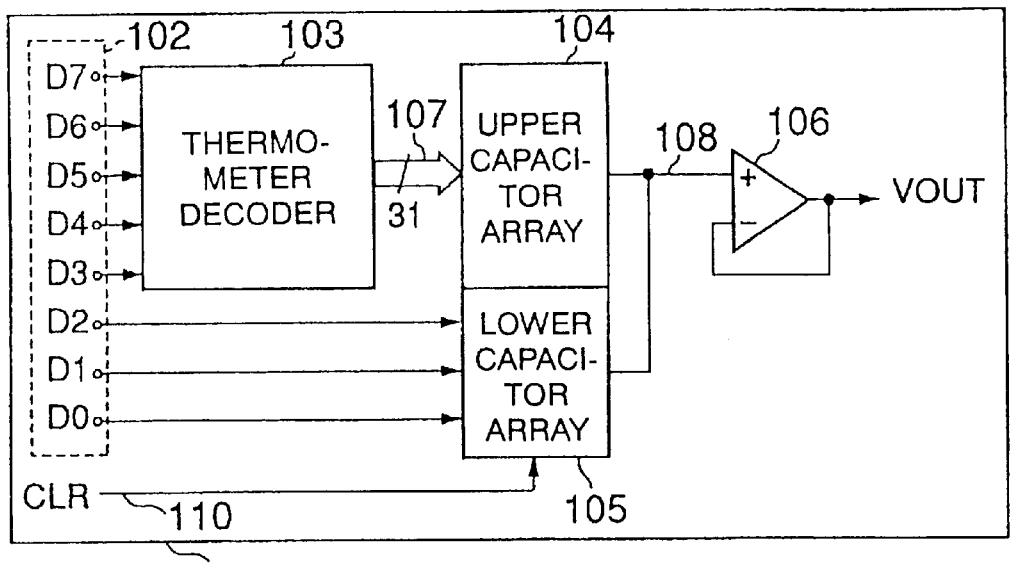
FIG. 5 is a block diagram of a D/A converter according to one embodiment of this invention.

Referring to FIG. 5, a D/A converter 101 according to one embodiment of this invention is an 8-bit D/A converter which is supplied with an input digital code 102 comprising eight bits D0 through D7 and separately processes the upper five bits D3 through D7 and the lower three bits D0 through D2. The D/A converter 101 comprises a thermometer decoder 103, an upper capacitor array 104, a lower capacitor array 105, and an output amplifier 106.

Figure 6:
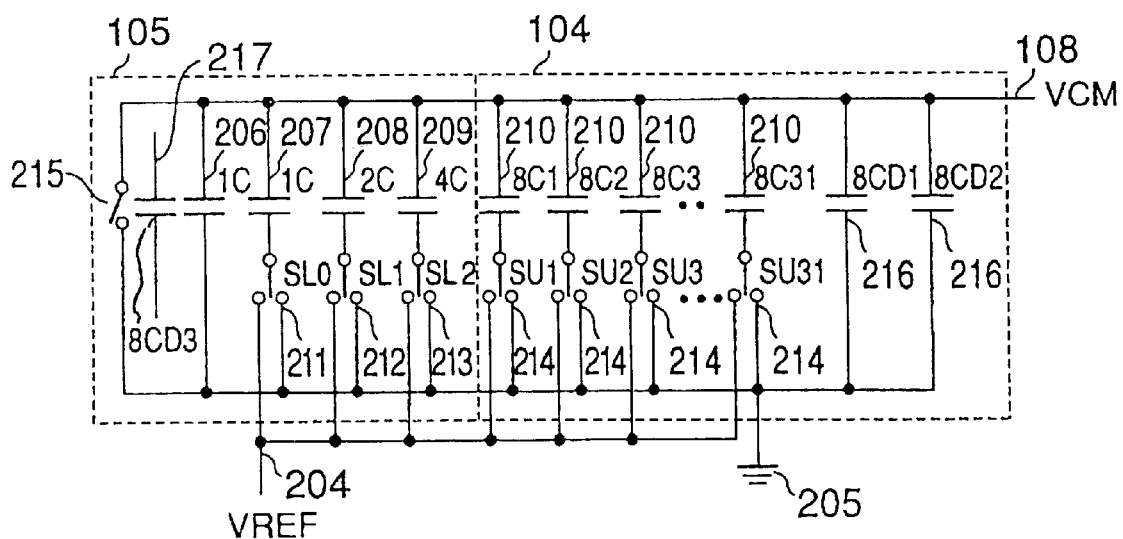
FIG. 6 is a view showing a circuit structure of an upper capacitor array and a lower capacitor array illustrated in FIG. 5.

Referring to FIG. 6, the upper capacitor array 104 includes a plurality of capacitors 210, 31 in number, each of which has a capacitance value 8C equal to eight times a unit capacitance value C or 1C. In this connection, the capacitors 210 are also referred to as 8C1 through 8C31. The upper capacitor array 104 is controlled by a control signal 107 from the thermometer decoder 103.

The thermometer decoder 103 is supplied with the upper five bits D3 through D7 of the input digital code 102 as first through fifth input bits of a decoder input signal. The thermometer decoder 103 decodes the upper five bits D3 through D7 of the input digital code 102 (the first through the fifth input bits of the decoder input signal) to produce the control signal 107 for controlling the number of selected ones of the capacitors 210 (8C1 through 8C31 in FIG. 6) of the upper capacitor array 104 which are to be connected to a reference voltage VREF (FIG. 6).

Referring to FIG. 7, the input bits D3 through D7 and output bits T1 through T31 of the signal 107 of the thermometer decoder 103 in FIG. 5 have a relationship illustrated in the figure.

Figure 2:
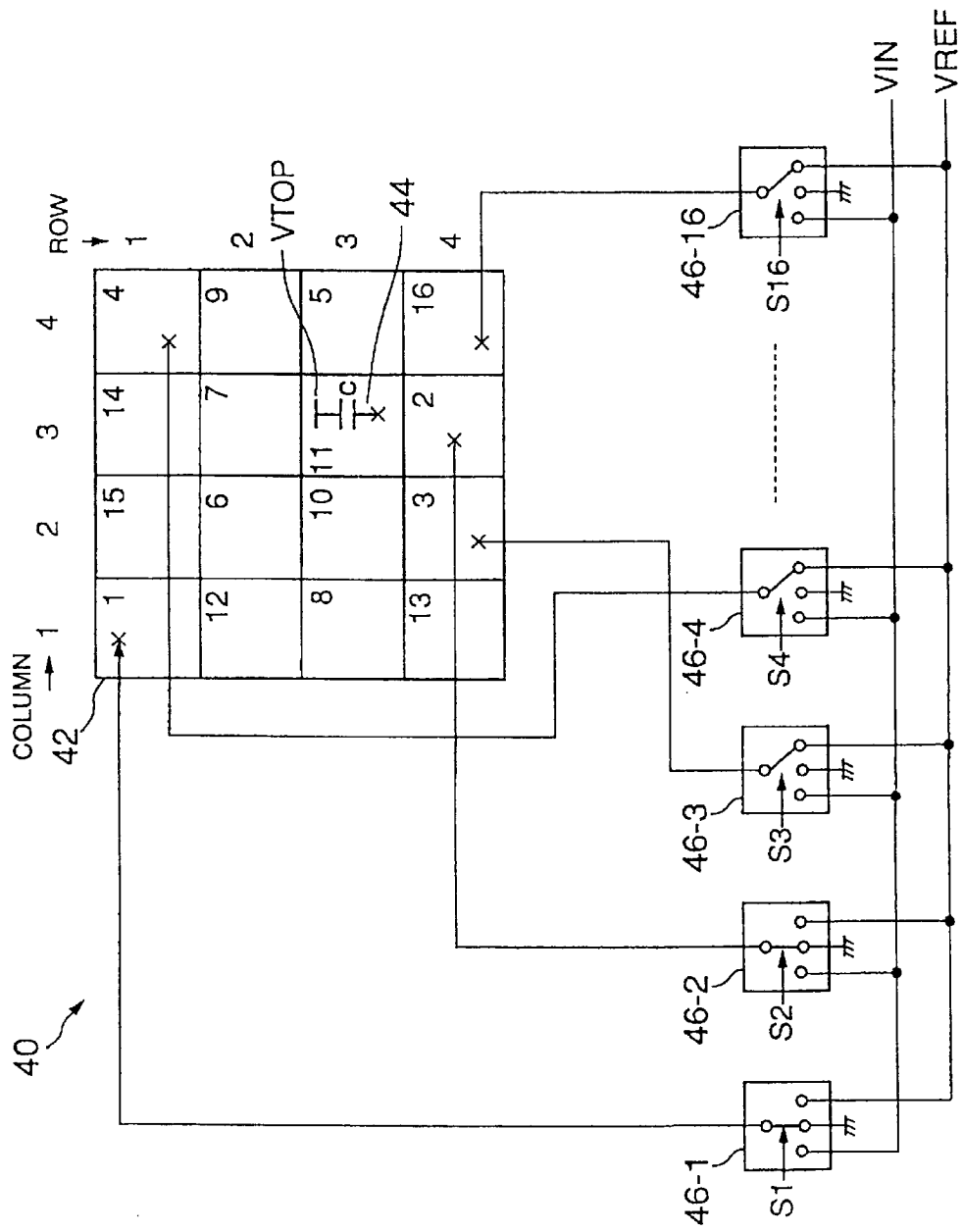
FIG. 2 shows a capacitor arrangement in a second conventional technique.
Figure 3:
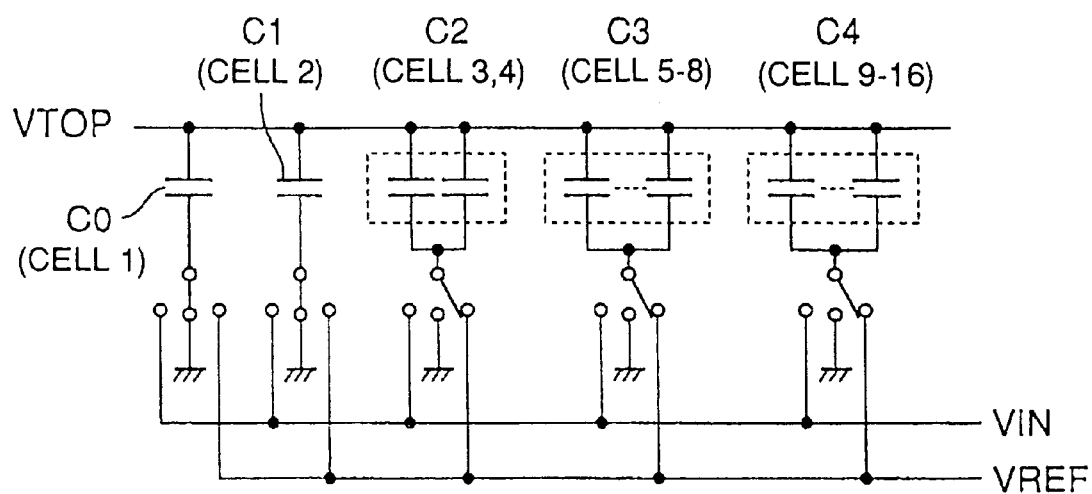
FIG. 3 is a view for describing binary-weighted capacitors in the capacitor arrangement in FIG. 2.

Referring to FIG. 8, a three-bit input thermometer decoder has a relationship between the input bits D3 through D5 and the output bits T1 through T7 as illustrated in the figure. The similar relationship between the input and the output of the thermometer decoder is also shown in FIG. 2 of the above-mentioned U.S. Pat. No. 6,236,346.

Generally, assuming that the number of the input bits and the number of the output bits of the thermometer decoder are equal to m and n, respectively, the relationship $n=2^m-1$ holds. As seen from FIGS. 7 and 8, the thermometer decoder is operable as follows. If the number represented by the input bits (D3, D4, D5) is equal to "1", the first bit (least significant bit) T1 among the output bits T1 through Tn is activated (set to "1"). If the number represented by the input bits (D3, D4, D5) is equal to "2", the first and the second bits T1 and T2, two bits in total, among the output bits T1 through Tn are activated. If the number represented by the input bits (D3, D4, D5) is equal to "3", the first, the second, and the third bits T1, T2, and T3, three bits in total, among the output bits T1 through Tn are activated.

Thus, the output bits T1 through Tn produced by the thermometer decoder follow a so-called thermometer coding rule in which, when an r-th output bit Tr is activated (set to "1"), all of the lower-order output bits T1 through Tr-1 (i.e., the first through the (r-1)-th bits) are activated also. Generally in a weighted D/A converter, the linearity is often deteriorated at a code where an upper bit is turned from 0 to 1. However, by the use of the thermometer decoder, it is possible to considerably suppress the deterioration in linearity. The thermometer decoding operation of the thermometer decoder is disclosed in the above-mentioned U.S. Pat. No. 6,236,346.

Turning to FIG. 5, the lower capacitor array 105 comprises an array of a plurality of capacitors 206 to 209 having capacitance values weighted in three bits as will later be described. The lower capacitor array 105 is directly controlled by the lower three bits D0, D1, and D2 of the input digital code 102.

The output amplifier 106 is supplied with a combined output 108 of the upper and the lower capacitor arrays 104 and 105 and produces an amplified output with a low impedance. A clear signal (CLR) 110 serves to clear electric charges of each of the capacitors in the upper and the lower capacitor arrays 104 and 105.

Referring to FIG. 6, description will be made of a circuit structure including the upper and the lower capacitor arrays 104 and 105 illustrated in FIG. 5.

The lower capacitor array 105 comprises the capacitors 206 to 209 weighted in three bits. Specifically, each of the capacitors 206 and 209 has a unit capacitance value 1 C. The capacitor 208 has a capacitance value 2C equal to twice the unit capacitance value 1C. The capacitor 209 has a capacitance value 4C equal to four times the unit capacitance value 1C.

The capacitor 206 (1C) is connected between the output 108 and a ground (GND) 205.

The capacitor 207 (1C) is connected via a switch 211 (SL0) to the VREF 204 or the GND 205. The switch 211 (SL0) is controlled by the zeroth bit (D0 in FIG. 5) of the input digital code. Specifically, the capacitor 207 (1C) is connected by the switch 211 (SL0) to the VREF 204 and the GND 205 when the zeroth bit (D0) of the input digital code has a logic "1" level and a logic "0" level, respectively.

The capacitor 208 (2C) is connected via a switch 212 (SL1) to the VREF 204 or the GND 205. The switch 212 (SLI) is controlled by the first bit (D1 in FIG. 5) of the input digital code. Specifically, the capacitor 208 (2C) is connected by the switch 212 (SL1) to the VREF 204 and the GND 205 when the first bit (Dl) of the input digital code has a logic "1" level and a logic "0" level, respectively.

The capacitor 209 (4C) is connected via a switch 213 (SL2) to the VREF 204 or the GND 205. The switch 213 (SL2) is controlled by the second bit (D2 in FIG. 5) of the input digital code. Specifically, the capacitor 209 (4C) is connected by the switch 213 (SL2) to the VREF 204 and the GND 205 when the second bit (D2) of the input digital code has a logic "1" level and a logic "0" level, respectively.

The upper capacitor array 104 comprises the capacitors 210 (8C1 through 8C31), 31 in number, which are connected via 31 switches 214 (SU1 through SU31) to the VREF 204 or the GND 205, respectively. The switches 214 (SU1 through SU31) are controlled by the output bits T1 through T31 (FIG. 7) of the 31-bit output signal 107 of the thermometer decoder 103 in FIG. 5, respectively. At this time, each of the switches 214 (SU1 through SU31) supplied with the output bits T1 through T31 of the thermometer decoder 103 performs a switching operation such that a corresponding one of the capacitors 210 (8C1 through 8C31) is connected to the VREF 204 and the GND 205 if the corresponding output bit supplied thereto has a logic "1" level and a logic "0" level, respectively.

Each of the capacitors 210 of the upper capacitor array 104 is controlled by the upper five bits D3 through D7 of the input digital code via the thermometer decoder 103 to be connected to the VREF 204 or the GND 205. On the other hand, the capacitors 207 through 209 of the lower capacitor array 105 are directly controlled by the lower three bits D0 through D2 of the input digital code to be individually connected to the VREF 204 or the GND 205. In the above-mentioned manner, a combination of the upper and the lower capacitor arrays 104 and 105 performs capacitive voltage division. A resultant voltage obtained by the capacitive voltage division is produced at the output 108 as VCM.

A switch 215 serves to clear initial charges of each of the capacitors of the upper and the lower capacitor arrays 104 and 105 so that the capacitive voltage division is properly carried out. The switch 15 is controllably turned on in response to the clear signal (CLR) 110 in FIG. 5.

Two dummy capacitors 216 (8CD1, 8CD2) are arranged outside the upper capacitor array 104 so as to suppress the influence of variation in production accuracy of the capacitors 210 (8C1 through 8C31) of the upper capacitor array 104. Likewise, a dummy capacitor 217 (8CD3) is arranged outside the lower capacitor array 105 so as to suppress the influence of variation in production accuracy of the capacitors 206 through 209 (1C, 1C, 2C, 4C) of the lower capacitor array 105. Each of the dummy capacitors 216 and 217 has a capacitance value 8C.

Figure 9:
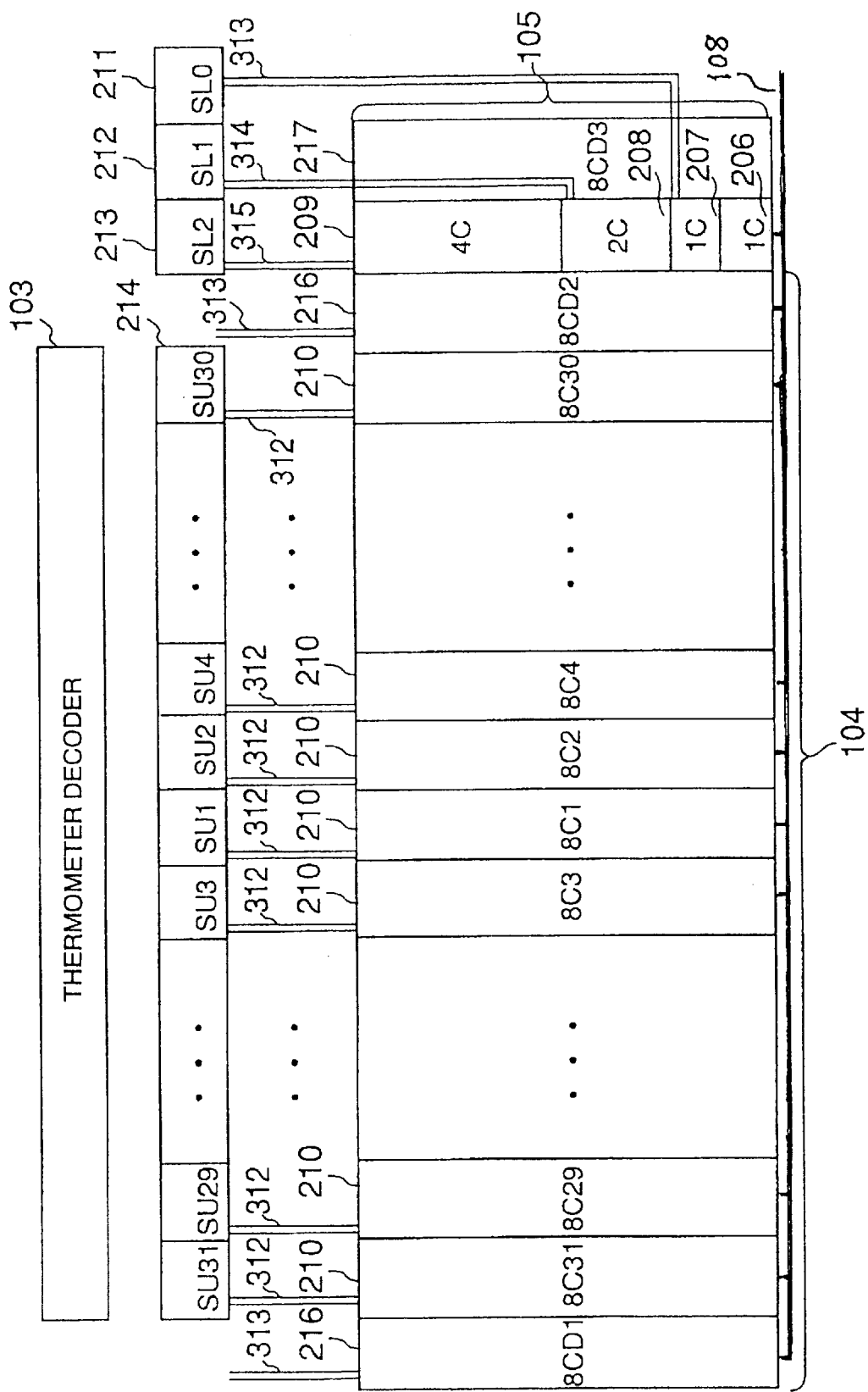
FIG. 9 is a view showing a capacitor arrangement in the upper and the lower capacitor arrays illustrated in FIG. 6.

Referring to FIG. 9, description will be made of an arrangement of the capacitors of the upper and the lower capacitor arrays 104 and 105 in FIG. 6 according to this invention. The upper capacitor array 104 has a main area in which the 31 capacitors 210 (8C1 through 8C31) are arranged. In this event, the 31 capacitors 210 (8C1 through 8C31) are arranged in the main area and in a row direction of the upper capacitor array 104 consecutively from the center of the array 104 outward to the left and the right to be symmetrical. The lower capacitor array 105 is arranged at one side of the upper capacitor array 104. The dummy capacitor 217 (8CD3) is arranged outside the lower capacitor array 105 to suppress the influence of variation in production accuracy of the capacitors 206 to 209 (1C, 1C, 2C, 4C). In the upper capacitor array 104, the dummy capacitors 216 (8CD 1, 8CD2) are arranged in the main area at both sides of the 31 capacitors 210 (8C1 through 8C31) to suppress the influence of variation in production accuracy thereof. The switches 214 (SU1 through SU31) for connecting the upper capacitor array 104 to the VREF or the GND are arranged in an additional area of the upper capacitor array 104. The additional area is adjacent to the main area in a column direction which is perpendicular to the row direction and along which unit capacitors (or capacitance elements) each having a unit capacitance value 1C are arranged in each of the capacitors 8C1 through 8C31. The switches 214 (SU1 through SU31) are arranged in the row direction consecutively from the center outward to the left and the right to be symmetrical. The switches 214 (SU1 through SU31) and the 31 capacitors 210 (8C1 through 8C31) of the upper capacitor array 104 are connected via connection lines 312 which are extended only in the column direction without intersecting with one another. The switches 211 through 213 (SL0 through SL2) for connecting the lower capacitor array 105 to the VREF or the GND are arranged in an adjacent area adjacent to the lower capacitor array 105 in the column direction. The switches 211 through 213 (SL0 through SL2) and the capacitors 209 (4C), 208 (2C), and 207 (1C) of the lower capacitor array 105 are connected via connection lines 312 which are extended only in the column direction. The dummy capacitors 216 (8CD1 and 8CD2) are connected to the GND 205 through connection lines 313 which are extended only in the column direction.

As mentioned above, the D/A converter according to this invention comprises the first capacitor array corresponding to the upper bits which are subjected to thermometer control and the second capacitor array corresponding to the lower bits which are not subjected to the thermometer control. In the first capacitor array, the unit capacitors in each of the capacitors 210 (8C1 through 8C31) are arranged in a single column. The capacitor columns of the 31 capacitors 210 are symmetrically arranged from the center outward to the left and the right in the order of selection. With this structure, it is possible to suppress the deterioration in linearity of the D/A converter due to the variation in capacitance value of the respective unit capacitors as a result of variation in production accuracy. The switches for controlling the first and the second capacitor arrays are arranged only at one side in the column direction so that the connection lines connecting the unit capacitors and the switches are extended only in the column direction. In addition, the dummy capacitors for suppressing the influence of variation in production accuracy are connected to the GND via the connection lines extended only in the column direction. With this structure, it is possible to suppress the deterioration in linearity due to the error in output voltage of the D/A converter as a result of coupling between the capacitor and the connection line for connecting the capacitor and the switch for controlling the capacitor.

Figure 10:
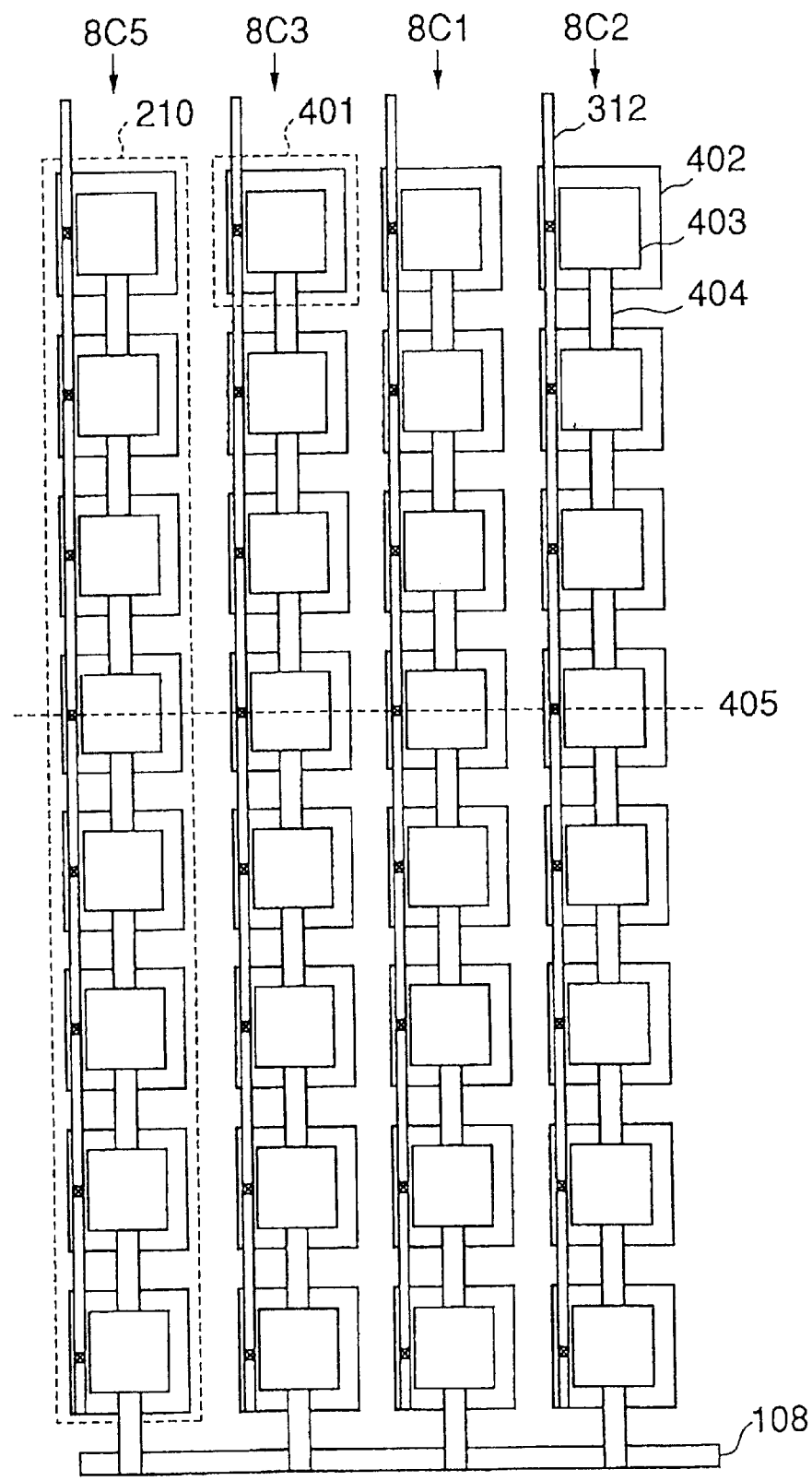
FIG. 10 is a view showing a part of the capacitor arrangement illustrated in FIG. 9.

Referring to FIG. 10, a part of the capacitor arrangement including the capacitors 210 (8C5, 8C3, 8C1, and 8C2) in FIG. 9 is shown in detail. Each of the capacitors 210 (8C5, 8C3, 8C1, and 8C2) comprises eight unit capacitors 401 connected in parallel. Each of the unit capacitors 401 has a unit capacitance value 1C and comprises a switch-side electrode 402 and a common electrode 403. In each capacitor 210, the switch-side electrodes 402 of the eight unit capacitors 401 are connected to one another by the connection line 312. In each capacitor 210, the common electrodes 403 of the eight unit capacitors 401 are connected to one another by a connection line 404.

The remaining ones of the capacitors 210 (8C1 through 8C31) in FIG. 9 are also similar in structure to the capacitors 210 (8C5, 8C3, 8C1, and 8C2) illustrated in FIG. 10.

In FIG. 10, each capacitor 210 (8C) is formed by connecting the eight unit capacitors 401 each of which comprises the switch-side electrode 402 and the common electrode 403. The common electrodes 403 are connected to one another by the connection line 404 while the switch-side electrodes 402 are connected to one another by the connection line 312. The common electrodes 403 of all of the capacitors 210 (8C) are connected by the connection line 404 to produce the VCM 108 illustrated in FIG. 5.

Figure 11:
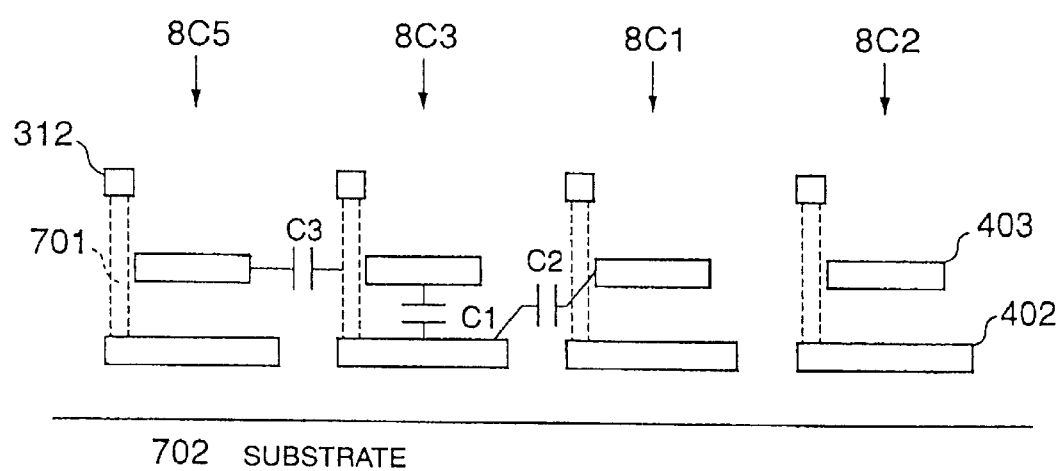
FIG. 11 is a sectional view taken along a line 405 in FIG. 10.

Referring to FIG. 11, the switch-side electrode 402 and the connection line 312 are connected via a contact 701. A substrate is depicted by a reference numeral 702. Capacitors C1, C2, and C3 act upon the common electrodes 403 (in this case, all of the common electrodes 403 because they are connected to one another) by the connection line 312 connected to the capacitor 210 (8C3). Capacitive voltage division is carried out with reference to the total sum of capacitance values of capacitors C1, C2, and C3 for all of the connection lines 312 to determine the output voltage of the D1A converter. The capacitor C1 has a capacitance value equal to that of the unit capacitor 401 forming the capacitor 210 (8C3). The capacitor C2 is a coupling capacitor between the switch-side electrode 402 of the capacitor 210 (8C3) and the common electrode 403 of the capacitor 210 (8C1). The capacitor C3 is a coupling capacitor between the switch-side electrode 402 of the capacitor 210 (8C3) with the connection line 312 and the contact 701 connected thereto and the common electrode 403 of the capacitor 210 (8C5). Although the capacitor C1 alone is desired to act upon the common electrode 403 by the connection line 312 in the capacitor 210 (8C3), the coupling capacitors C2 and C3 are present as described above. This results in occurrence of an error corresponding to the coupling capacitors C2 and C3. The same applies to the connection lines 312 connected to the remaining ones of the capacitors 210 (8C1 to 8C31).

Referring to FIGS. 9 through 11, description will be made of the characteristic of the arrangement together with the operation of the D/A converter illustrated in FIG. 5.

The thermometer decoder 103 illustrated in FIG. 5 is supplied with the upper five bits D3 through D7 among the input bits D0 through D7 of the input digital code 102. The thermometer decoder 103 carries out a decoding operation in the manner such that, every time when the number represented by the input digital code 102 increases by 8, one of the capacitors 210 (8C) of the upper capacitor array 104 in FIG. 9 is additionally connected to the VREF. In the upper capacitor array 104, the 31 capacitors 210 (8C) are symmetrically arranged from the center outward to the left and the right. Therefore, every time when the number represented by the input digital code 102 is increased by 8, the capacitors 210 (8C) are successively connected one by one to the VREF in the order starting from the capacitor 210 (8C1) arranged at the center of the array.

Figure 12:
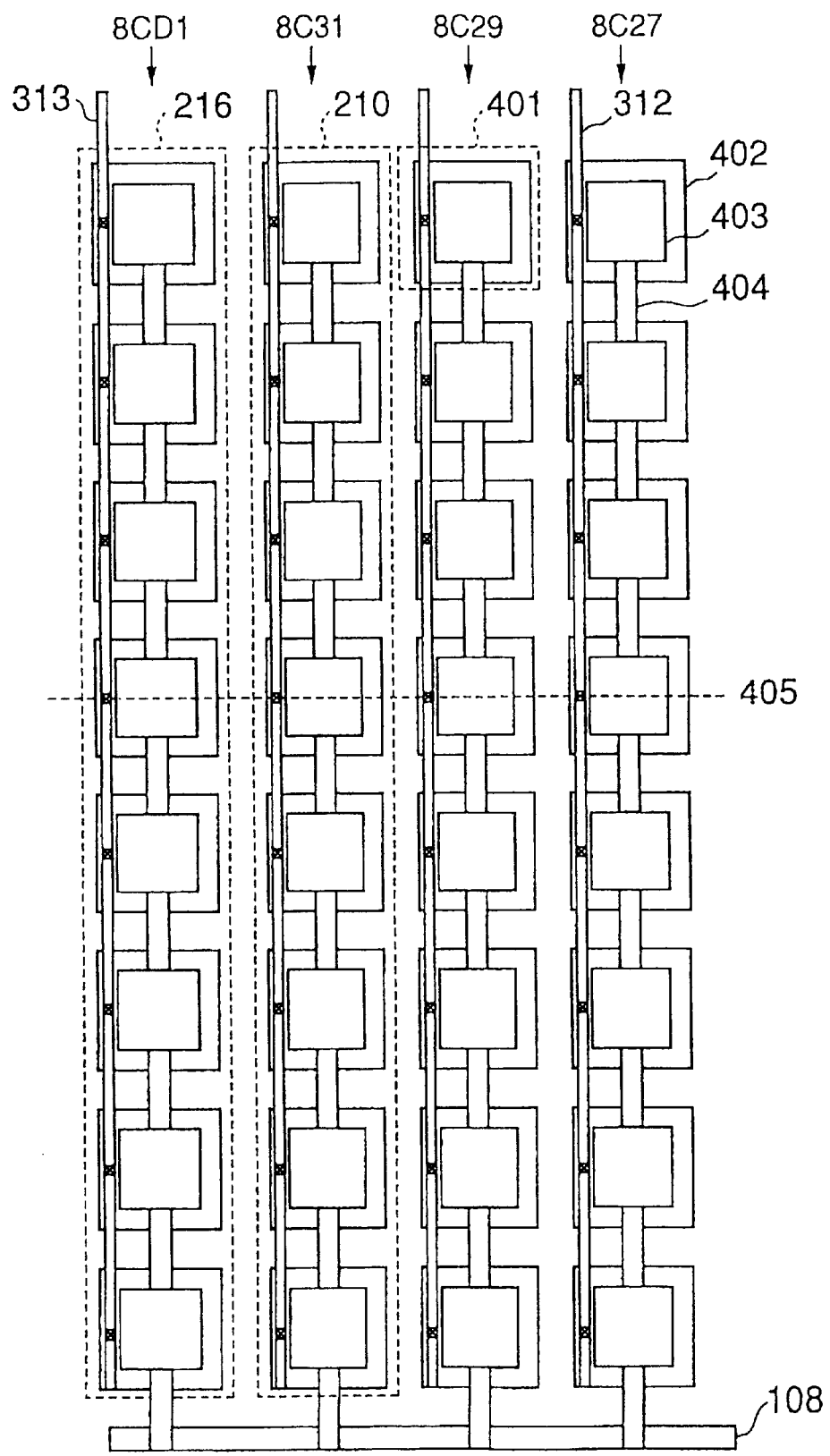
FIG. 12 is a view showing a part of the capacitor arrangement illustrated in FIG. 9.
Figure 13:
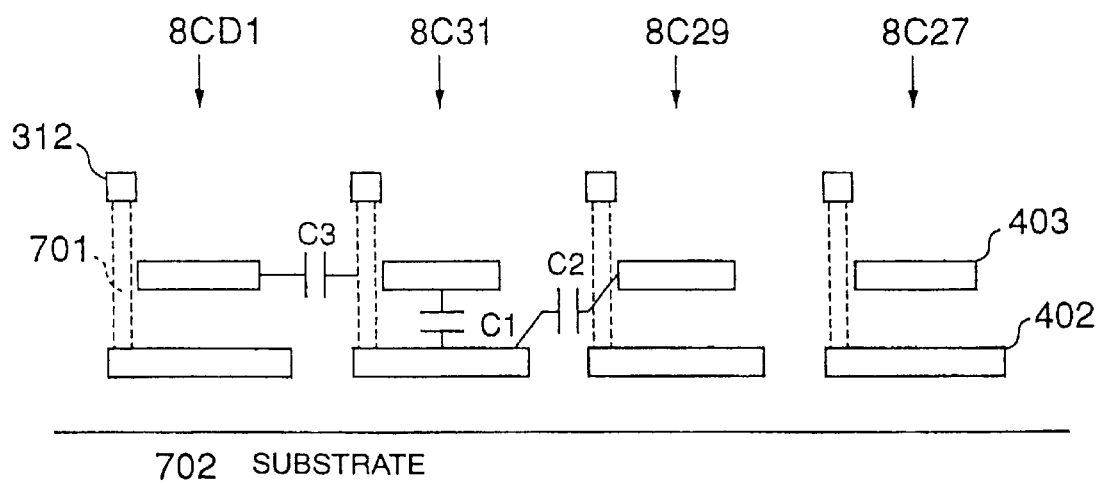
FIG. 13 is a sectional view taken along a line 405 in FIG. 12.

Referring to FIG. 12, a part of the capacitor arrangement including the capacitors 216 (8CD1) and 210 (8C31, 8C29, and 8C27) is shown in detail. The capacitors 210 (8C31, 8C29, and 8C27) are arranged in a manner similar to FIG. 10 and the dummy capacitor 216 (8CD1) for suppressing the influence of variation in production accuracy is similarly arranged. Referring to FIG. 13, the capacitors C1, C2, and C3 similarly act because the dummy capacitor 216 (8CD1) is arranged in a manner similar to the capacitors 210 (8C1 through 8C31).

Next, another embodiment of this invention will be described in detail with reference to the drawing.

Figure 14:
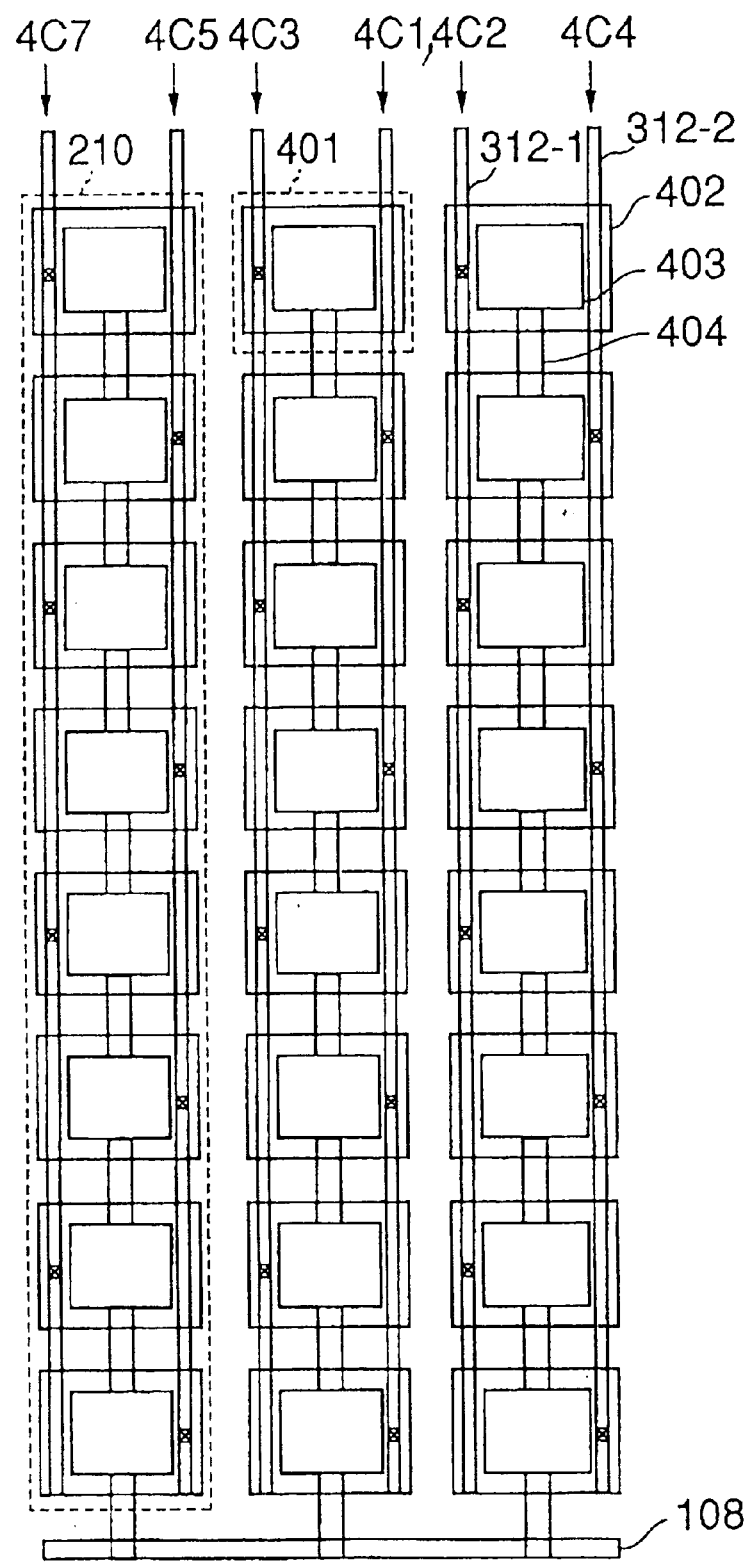
FIG. 14 is a view for describing a capacitor arrangement of a D/A converter according to another embodiment of this invention.

Referring to FIG. 14, another capacitor arrangement is illustrated in case where the D/A converter in FIG. 5 is modified so that the thermometer decoder 103 is supplied with upper six bits D2 through D7 of the input digital code 102. In this case, the thermometer decoder 103 controls 63 capacitors 210 (4C1 through 4C63) each of which has a capacitance value equal to four times the unit capacitance value 1C. Since the number of bits controlled by the thermometer decoder is increased by one, higher accuracy can be achieved. For the capacitors in a single column, two switches (see 214 in FIGS. 6 and 9) are arranged. In each column, the switch-side electrodes 402 of the four unit capacitors 401 are connected via a connection line 312-1 to one of the two switches while the switch-side electrodes 402 of the remaining four unit capacitors 401 are connected via a connection line 312-2 to the other of the two switches. In this case also, the switches are arranged at the one side. The connection lines connecting the unit capacitors and the switches are extended only in the column direction.

Now, the effects of this invention will be described.

As a first effect of this invention, it is possible to suppress the deterioration in linearity of the D/A converter due to the variation in capacitance value as a result of variation in production accuracy.

The reason is as follows. If all of the capacitance values of the unit capacitors in the capacitor array are equal to one another, the D/A converter will exhibit an ideal characteristic as an output voltage characteristic. On the contrary, if the capacitance values of the unit capacitors are different from one another, the output voltage characteristic of the D/A converter is deteriorated in linearity. Generally, in case of the weighted capacitor array, the variation in capacitance value of the capacitors corresponding to the upper bits of the input digital code has a large influence upon the linearity of the D/A converter. Actually, however, the variation in production accuracy is inevitable. For example, the variation in shape of the electrodes forming the capacitors and the variation in thickness of a dielectric film between the electrodes cause the variation in capacitance value. The variation in capacitance value includes random variation and the variation having some in-plane tendency. As illustrated in FIG. 9, the upper capacitor array 104 giving a large influence upon the linearity of the D/A converter has a structure in which the 31 capacitors 210 (8C) are arranged from the center of the array towards the outside. Controlled by the thermometer decoder 103, one of the capacitors 210 (8C) is additionally connected to the VREF every time when the number represented by the input digital code 102 increases by eight. Therefore, the capacitors 210 (8C) connected to the VREF every time when the number represented by the input digital code 102 increases by 16 are adjacent to one another. The variation in capacitance value between adjacent capacitors is very small so that the D/A converter as a whole has an output voltage characteristic exhibiting excellent linearity. Since the 31 capacitors 210 (8C) are symmetrically arranged, it is possible to reduce the influence of the random variation in capacitance value of the upper capacitor array as a whole.

As a second effect of this invention, it is possible to prevent the deterioration in linearity of the D/A converter under the influence of the parasitic capacitance.

The reason is as follows. The switches for connecting the unit capacitors in the capacitor array to the VREF or the GND are arranged above the capacitor array and the connection lines for connecting the capacitors and the switches are extended from only one side. In this manner, the influence of the parasitic capacitance deteriorating the linearity is reduced. The output voltage of the capacitor-array D/A converter is determined by capacitive voltage division of a total sum of (1) the capacitance values of the respective unit capacitors, (2) the capacitance values of the coupling capacitors produced between the array capacitors and the connection lines for connecting the array capacitors and the switches, and (3) the capacitance values of the coupling capacitors produced between the array capacitors and the connection lines for connecting the array capacitors to one another. Since the switches for connecting the capacitors to the VREF or the GND are arranged only at one side as illustrated in FIG. 9, each of the connection lines for connecting the array capacitors and the switches is extended exclusively over the corresponding array capacitor controlled by the connection line as illustrated in FIG. 10. With this structure, there is no coupling capacitor produced between the array capacitor and the connection line for controlling another array capacitor (i.e., the connection line connecting another array capacitor and the corresponding switch). The array capacitors are arranged from the center of the array towards the outside in the order of connection to the VREF under control of the thermometer decoder. Accordingly, the following relationship always exists. In case where the particular capacitor (comprising a single column of the unit capacitors) is connected to the VREF, all of the capacitors nearer to the center than the particular capacitor are connected to the VREF while all of the capacitors outside the particular capacitor are connected to the GND. This means that the coupling capacitances C2 and C3 acting upon the common electrodes in adjacent columns as illustrated in FIG. 11 are constant in coupling action. Accordingly, the total capacitance value as a sum of C1, C2, and C3 is always constant. As a result, no influence is given to the linearity. The dummy capacitors (216 (8CD1, 8CD2) in FIG. 9) are arranged on both sides of the array so as to reduce the influence of variation in production accuracy and are connected to the GND. With this structure, the influence of the parasitic capacitance is constant throughout the array up to the outermost capacitors except the dummy capacitors. Thus, excellent linearity can be kept over a range of all input codes.

As a third effect of this invention, an increase in accuracy can be achieved while an increase in scale of the circuit and the layout is suppressed.

This is because the number of the upper bits subjected to thermometer control can easily be increased. In the capacitor array D/A converter, the number of unit capacitors is remarkably increased if the resolution is increased, in particular, to 8 bits or more. For example, 8 bit resolution and 10 bit resolution require the unit capacitors, 256 and 1024 in number, respectively. In order to efficiently save the area of the capacitor array with such a large number of unit capacitors, a square-like arrangement must be used. It will readily be understood for those skilled in the art that the accuracy of the D/A converter can be increased by increasing the number of the upper bits subjected to the thermometer control. However, if the number of the upper bits subjected to the thermometer control is increased in the D/A converter having high resolution such as 8 bits or 10 bits, the number of switches for connecting the capacitors to the VREF or the GND and the number of connection lines for connecting the switches and the capacitors are remarkably increased. For example, in case of upper five bits and upper six bits, the number of the switches or the connection lines is equal to 31 and 63, respectively. In the capacitor-array D/A converter, if the square-like arrangement is used in order to efficiently save the area of the capacitor array and the number of the upper bits subjected to thermometer control is increased to improve the accuracy as described above, the linearity may possibly be deteriorated due to the coupling capacitors between the array capacitors and the connection lines as described in conjunction with the second effect. However, in the arrangement of this invention, the linearity is not deteriorated under the influence of the coupling capacitors between the capacitors and the connection lines. In FIG. 14, two switches are arranged for a single column of unit capacitors. With this structure, the number of the upper bits subjected to the thermometer control can be increased to improve the accuracy while the influence of the coupling capacitors is suppressed.

What is claimed is:

1. A capacitor-array D/A converter which comprises:

a thermometer decoder (103) for thermometer-decoding a decoder input signal having first through m-th input bits (D3 to D7) to produce an output signal (107) having first through n-th output bits (T1 to T31), where m is an integer not less than two and where n is equal to $(2^m-1)$;

first through n-th switches (SU1 to SU31) corresponding to said first through said n-th output bits of said thermometer decoder; and a capacitor array (104) comprising first through n-th capacitors (8C1 through 8C31) corresponding to said first through said n-th switches;

each of said first through said n-th switches being supplied with a corresponding bit of said first through said n-th output bits from said thermometer decoder, said corresponding bit corresponding to said each of the first through the n-th switches, each of the first through the n-th switches operating so that, when said corresponding bit has a logic "1" level, a corresponding capacitor of said first through n-th capacitors is applied with a predetermined voltage (VREF) not equal to zero and that, when said corresponding bit has a logic "0" level, said corresponding capacitor is grounded (205), said corresponding capacitor corresponding to said each of the first through the n-th switches;

said capacitor array having a main area;

said first through said n-th capacitors being arranged in said main area and in a row direction of said capacitor array consecutively in the order of selection from the center outward, alternating to the left and the right, to be symmetrical.

2. A capacitor-array D/A converter as claimed in claim 1, further comprising first through n-th connection lines (312) corresponding to said first through said n-th switches;

each of the first through the n-th switches operating so that, when said corresponding bit has a logic "1" level, said corresponding capacitor is applied with said predetermined voltage through a corresponding connection line of said first through said n-th connection lines and that, when said corresponding bit has a logic "0" level, said corresponding capacitor is grounded through said corresponding connection line, said corresponding connection line corresponding to said each of the first through the n-th switches.

3. A capacitor-array D/A converter as claimed in claim 2, said capacitor array having an additional area adjacent to said main area in a column direction which is perpendicular to said row direction, wherein:

said first through said n-th switches are arranged in said adjacent area of said capacitor array and in said row direction consecutively from the center outward to the left and the right to be symmetrical;

said first through said n-th connection lines extending in said column direction without intersecting with one another.

4. A capacitor-array D/A converter as claimed in claim 3, wherein:

said capacitor array further comprises dummy capacitors (8CD1, 8CD2) each of which does not correspond to any one of said first through said n-th switches and is permanently connected to the ground, said dummy capacitors being arranged in said main area at both sides of said first through said n-th capacitors.

5. A capacitor-array D/A converter as claimed in claim 1, wherein:

said first and said m-th input bits of the decoder input signal of said thermometer decoder are a least significant bit and a most significant bit of said decoder input signal, respectively;

said first and said n-th output bits of the output signal of said thermometer decoder being a least significant bit and a most significant bit of said output signal, respectively.

6. A capacitor array (104) for use in a capacitor-array D/A converter which comprises a thermometer decoder (103) for thermometer-decoding a decoder input signal having first through m-th input bits (D3 to D7) to produce an output signal (107) having first through nth output bits (T1 to T31), where m is an integer not less than two and where n is equal to ($2^m-1$); and first through n-th switches (SU1 to SU31) corresponding to said first through said n-th output bits of said thermometer decoder; said capacitor array comprising:

first through n-th capacitors (8C1 through 8C31) corresponding to said first through said n-th switches;

each of said first through said n-th switches being supplied with a corresponding bit of said first through said n-th output bits from said thermometer decoder, said corresponding bit corresponding to said each of the first through the n-th switches, each of the first through the n-th switches operating so that, when said corresponding bit has a logic "1" level, a corresponding capacitor of said first through said n-th capacitors is applied with a predetermined voltage (VREF) not equal to zero and that, when said corresponding bit has a logic "0" level, said corresponding capacitor is grounded (205), said corresponding capacitor corresponding to said each of the first through the n-th switches;

said capacitor array having a main area;

wherein said first through said n-th capacitors are arranged in said main area and in a row direction of said capacitor array consecutively in the order of selection from the center outward alternating to the left and the right, to be symmetrical.

7. A capacitor array as claimed in claim 6, wherein:

said first and said m-th input bits of the decoder input signal of said thermometer decoder are a least significant bit and a most significant bit of said decoder input signal, respectively;

said first and said n-th output bits of the output signal of said thermometer decoder being a least significant bit and a most significant bit of said output signal, respectively.

* * * * *